United States Patent [19]
Venbrux et al.

[11] Patent Number: 5,339,077
[45] Date of Patent: Aug. 16, 1994

[54] COMMA CODE GENERATOR

[75] Inventors: Jack Venbrux; Kelly Cameron, both of Moscow, Id.

[73] Assignee: Idaho Research Foundation, Inc., Moscow, Id.

[21] Appl. No.: 931,826

[22] Filed: Aug. 18, 1992

[51] Int. Cl.[5] .............................. H03M 7/40
[52] U.S. Cl. ............................... 341/67; 341/60
[58] Field of Search ................ 341/67, 60, 87, 50

[56] References Cited

U.S. PATENT DOCUMENTS

| | | | |
|---|---|---|---|
| 4,963,867 | 10/1990 | Bertrand | 341/60 |
| 5,021,782 | 6/1991 | Perron et al. | 341/67 |
| 5,060,242 | 10/1991 | Arbeiter | 341/67 X |
| 5,173,695 | 12/1993 | Sun et al. | 341/67 |
| 5,181,031 | 1/1993 | Tong et al. | 341/67 X |
| 5,233,348 | 8/1993 | Pollmann et al. | 341/67 |
| 5,237,701 | 8/1993 | Bertrand | 341/67 X |
| 5,245,338 | 9/1993 | Sun | 341/67 |
| 5,254,991 | 10/1993 | Ruetz et al. | 341/67 X |

OTHER PUBLICATIONS

"VLSI Chip-set for Data Compression Using the Rice Algorithm", J. Venbrux and N. Liu, NASA SERC 1990 Symposium on VLSI Design, 41–51, University of Idaho, Moscow, Id., Jan. 24, 1990.

"Lossless Image Compression Chip Set", Jack Venbrux and Norley Liu, Northcon, 145–150, Seattle, Wash., Oct. 9–11, 1990.

"A Very High Speed Lossless Compression/Decompression Chip Set", Jack Venbrux, Norley Liu, Kathy Liu, Peter Vincent and Randy Merrell, JPL Publication 91-13, Jun. 15, 1991.

*Primary Examiner*—Sharon D. Logan
*Attorney, Agent, or Firm*—Haverstock, Medlen & Carroll

[57] ABSTRACT

The preferred embodiment includes a method and apparatus for generating a comma code. A data word having a value m is received. A binary storage apparatus receives the data value. A storage apparatus is coupled to the output of the address calculator. The storage apparatus includes a plurality of single bit storage elements that are arranged to provide an M bit output. Each single bit storage element is initialized to a first value. The address calculator calculates the appropriate single bit storage element to be selectively inverted.

13 Claims, 4 Drawing Sheets

COMMA CODE GENERATOR

This invention was funded in part by the United States National Aeronautical and Space Administration under grant NAGW-1406; the United States government has certain rights in the invention.

FIELD OF INVENTION

This invention relates to the field of generating codes for data compression. More particularly, this invention relates to a method and apparatus for generating a comma code, a variable length code.

BACKGROUND OF THE INVENTION

Variable length codes are well known. Such codes, like the Huffman code, are often used because under certain circumstances, they allow the same amount of information found in fixed length codes to be coded to a fewer number of bits. Although related to Huffman codes, the variable length code generated according to the method and apparatus taught in this disclosure is called a comma code because each code word ends with the same terminating bit, such as a "1". The comma code for the integer m consists of m zeros followed by a "1". Thus, the code word for the data value m=5 would be 00001 (five "0"s followed by the terminating "1"). The total length of the comma code word corresponding to integer m is therefore m+1.

One data compression scheme, called the Rice Algorithm, uses this code extensively and calls it the "Fundamental Sequence." The advantage of using a comma code over a typical Huffman code is the comma code can be easily generated without the use of look up tables.

A prior system for generating a comma code utilizes linear shift registers and control logic. FIG. 1a is a block diagram illustrating the general configuration of such a method. A control circuit 20 is coupled to receive and transmit data from an input buffer 22. The control circuit 20 is also coupled to provide a serial data stream to an m bit serial shift register 24. The shift register 24 can provide a serial or parallel data output.

The control circuit 20 receives an input value m from the input buffer 22. The control circuit 20 then fills the shift register 24 with m zeros followed by a "1". Only then is the control circuit ready strobe in another value.

FIG. 1b provides an example in which the following bit pattern 0110 is input into the serial input of the shift register 24. The bit pattern can be viewed as containing two comma code words, "01" and "1", followed by the start of another code word that begins with a "0". Four clock cycles later the 4 bit pattern fills up the register and can be output as a 4 bit parallel output. An N bit code string requires N clock cycles to generate.

Using a linear shift register to create a comma code has several disadvantages. Besides being slow, the variable rate at which code words are generated makes it difficult to implement in a real time system. If data were input at a constant rate, a system would either have a maximum sized code word assigned and have the system specifically designed to be able to operate upon that sized code word (in order to handle a data stream at a sustained rate) or use a large input buffer to "average-out" the time required for the various code lengths. Designing for the longest code word slows the system down, while including an input buffer adds complexity to a system.

SUMMARY OF THE INVENTION

The present invention is for a method and apparatus for generating comma codes having greatly reduced the number of clock cycles required over a system using a linear shift register and control logic. A system according to the present invention can be designed to operate upon a maximum length code word. The system operates in a pipelined fashion but requires formatting and buffering at the output. Such a system utilizes a barrel shifter. The barrel shifter size increases with the size of the maximum code word.

A generalized embodiment of the present invention utilizes a memory array. The system can generate an arbitrarily long comma code word and perform data formatting in a single clock cycle with no added buffering required.

BRIEF DESCRIPTION OF THE DRAWINGS

FIG. 1a shows a block diagram of a prior art comma code generator.

FIG. 1b shows the contents of a register utilized in the circuit of FIG. 1a.

DETAILED DESCRIPTION OF THE PREFERRED EMBODIMENT

A system according to the present invention can generate a comma code word in a single clock pulse. Thus, the system is faster than a system using a shift register and does not require an input buffer.

The preferred embodiment includes a method and apparatus for generating a comma code. A data word having a data value m is received by the address calculator. A binary storage apparatus is coupled to receive the address value. The storage apparatus includes a plurality of single bit storage elements that are arranged to provide an M bit output. Each single bit storage element is initialized to a first value. The output of the address calculator specifies the appropriate single bit storage element to invert.

Generating the Comma Code by Barrel Shifting

In a comma code generator using a barrel shifter, the shifter shifts the terminating bit to the appropriate bit position in the code string. Throughout these examples, the terminating bit is a "1", however, an inverse comma code can be utilized having a terminating bit of "0" preceded by an appropriate number of "1"s.

A barrel shifter is a circuit that will shift between 0 and N−1 bits in one clock cycle. Barrel shifters can be designed to shift right, or left, or both, and may be designed to rotate data.

In the following example, a left shifting barrel shifter is used. The input of the barrel shifter is simply a "1" (all but the least significant bit (LSB) position is tied to "0"). (An equally valid approach would be to tie the most significant bit (MSB) to a "1" and use a right barrel shifter.) For a data value of m, there will be m zeros followed by a 1. Therefore, the amount of shifting required for each new code word is m+1, which is the size of the code word.

Figures 1A, 1B:
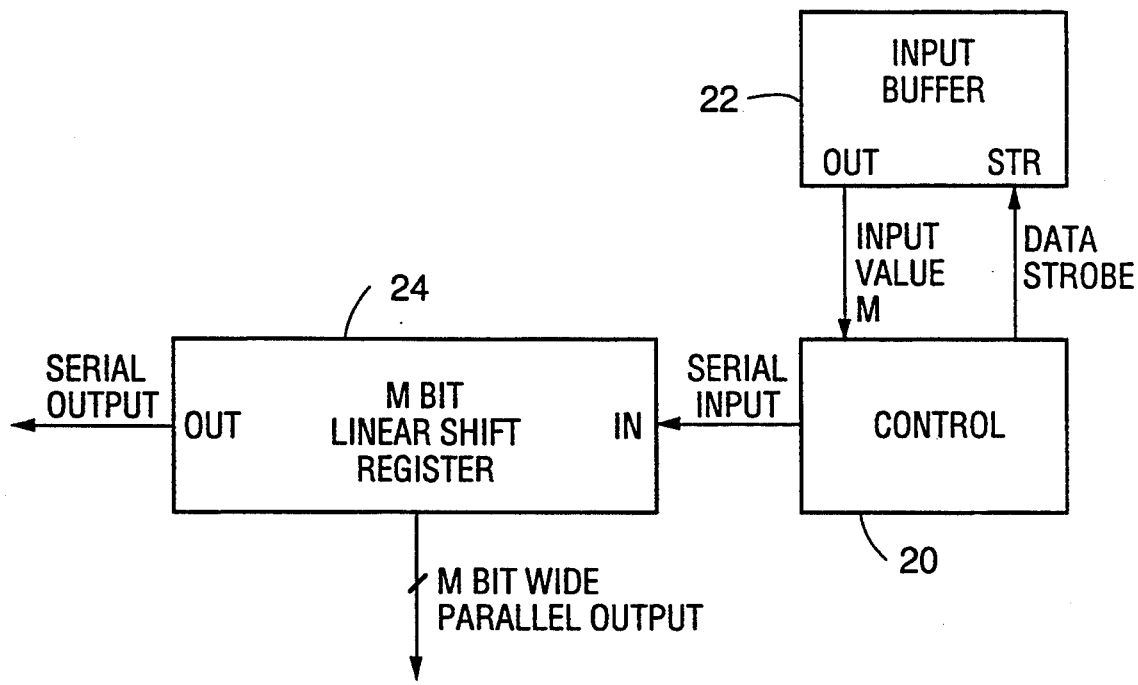
Figure 2:
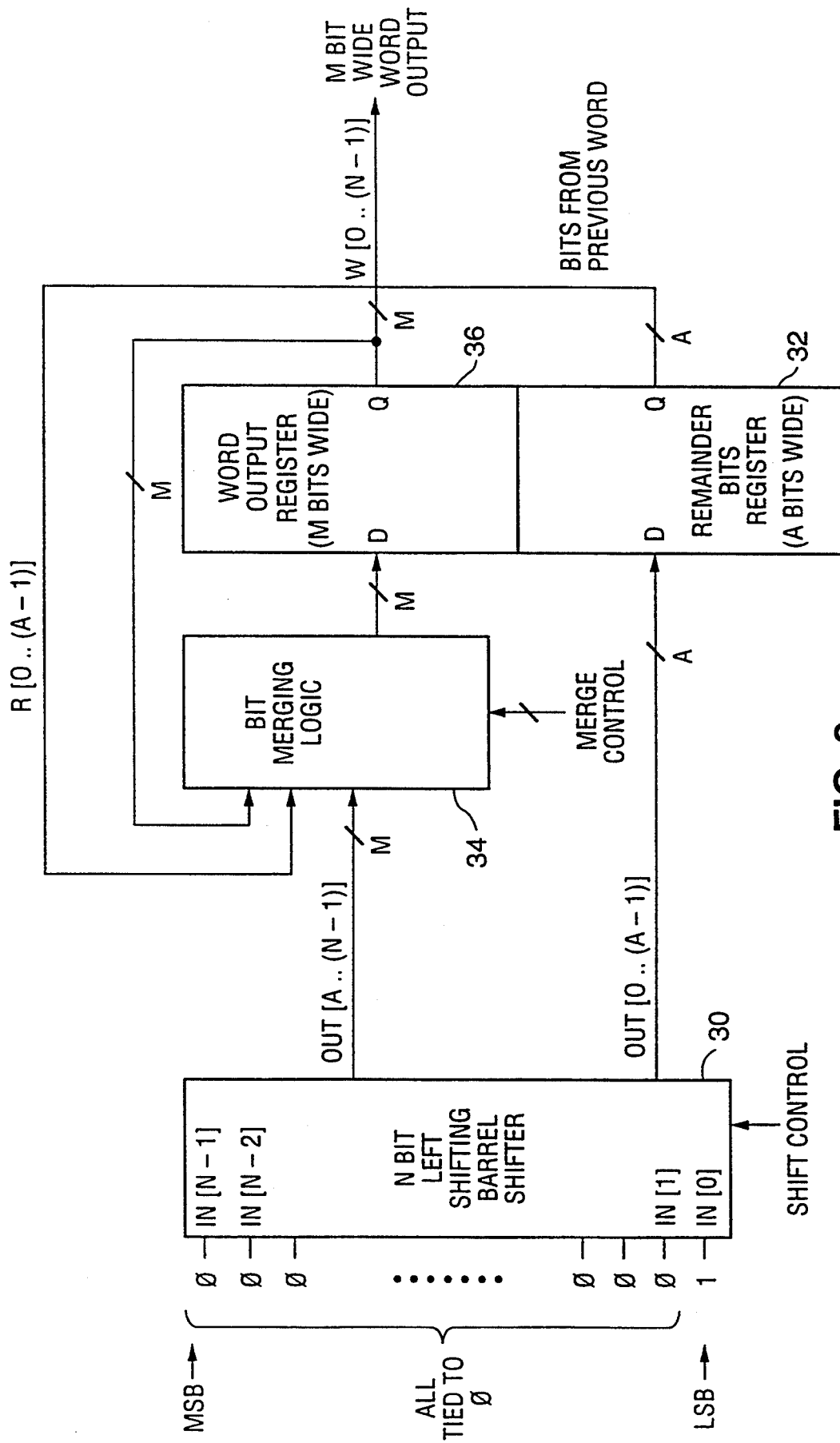
FIG. 2 shows a block diagram of a comma code generator utilizing a barrel shifter.

FIG. 2 shows a barrel shifter configuration with bit merging logic and storage registers. An N bit wide left shifting barrel shifter 30 has its LSB input coupled to "1" and all its remaining inputs coupled to "0". Outputs 0 through A-1 of the barrel shifter 30 are coupled to an A bit wide remainder register 32. Outputs A through N-1 (M bits) of the barrel shifter 30 are coupled to a bit merging logic circuit 34. The outputs of the merging logic circuit 34 are coupled to the word output register 36. The outputs of the remainder register 32 and the outputs of the word output register 36 are coupled to the input of the bit merging logic circuit 34.

In this example, code words will be formed from the top. The first code word having a value of m would generate a "1" at the m+1 bit position from the top. Additional code words are generated by shifting the "1" to the appropriate storage register. When the number of shifted bits equals or exceeds M, the output word size, data is output from output register 36.

Any remainder bits left in register 32 after outputting an M-bit word from the output register 36 are then shifted to the bit merging logic circuit 34. That data is then merged with the M most significant bits from the barrel shifter 30. When the total number of bits from previous code words plus the newly shifted bits is greater than or equal to M, another code word is output from the output register 36.

As long as the longest code word will always fit within the N bit barrel shifter output, any comma code word can be generated in one clock cycle. The size of the barrel shifter is set by the worst case condition: the word output register is one bit shy of having an M bit output word and then the next code word has maximum size. Defining Sm to be maximum code word size, the barrel shifter must be N=Sm+(M−1) bits wide.

To create very long code words without huge barrel shifters, more than one clock cycle may be used to generate a code word. Under such conditions, the control complexity would increase slightly because the shifter would have to write at least one clock cycle of only zeros before inserting the terminating "1" on the next or preceding clock cycles. This also requires that the LSB of the shifter have a signal input that is "0" when writing all "0"s and only a "1" when writing the terminating part of the code word.

The bit merging logic circuit 34 allows the output register to accept 3 possible sources of data:

1. The first code word of a block directly from the shift register. This initializes the word output register.
2. Remainder bits concatenated with a newly shifted code word.
3. Previous code words concatenated with a newly shifted code word.

Figure 3:
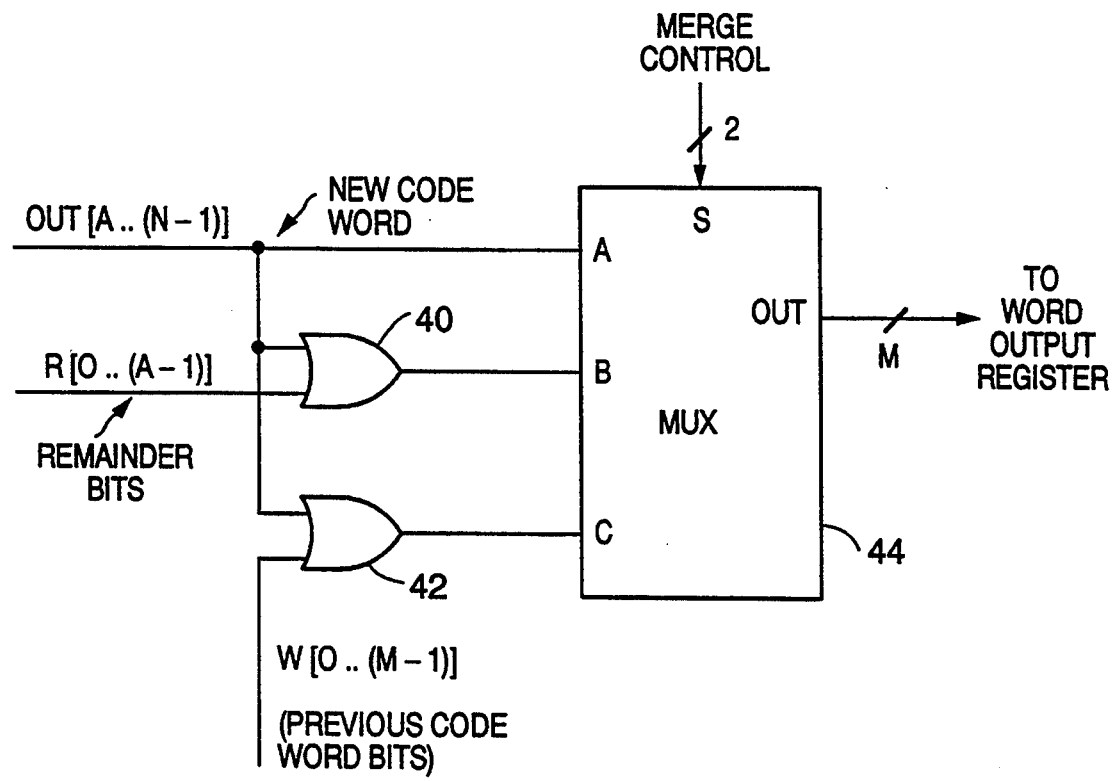
FIG. 3 shows a logic diagram of a bit merging logic circuit.

FIG. 3 shows a logic diagram of one circuit that implements the bit merging function of the logic circuit 34 (FIG. 2) and uses a multiplexor. The circuit 34 includes M similar selection modules one of which is shown in FIG. 3 and described below. A pair of OR gates, including a first OR gate 40 and a second OR gate 42, are coupled to receive one of the M output bits A through N−1 of the barrel shifter 30 (FIG. 2). The output from the barrel shifter 30 is also coupled to the first input of the multiplexor 44.

The first OR gates 40 is also coupled to the remainder bit register 32 (FIG. 2) to receive a corresponding one of the remainder bits. The output of the first OR gate 40 is coupled to a second input to the multiplexor 44.

The second OR gate 42 is also coupled to receive a corresponding one of a bit from a previous code word. The output of the second OR gate 42 is coupled to a third input to the multiplexor 44. The multiplexor 44 is coupled to operate under control of merge control signals and will appropriately select one of its three inputs.

The use of OR gates rather than more complex logic is made possible because the comma code word only has a single "1" as the terminating character. The barrel shifter 30 (FIG. 2) positions the "1" appropriately with preceding bits equal to "0"s. This allows merging a new code word by ORing in the "1" while keeping the previous bits in the word output register unchanged (A=A OR "0").

Generating the Comma Code with an Address Calculator and a Memory Array

The second embodiment of the present invention generates comma codes using an address calculator coupled to a memory array. Using an address calculator with a memory array allows generating arbitrary length code words in a single clock cycle while simultaneously formatting the code string into M bit words. Because this method can generate a large code word in a single clock cycle, input data does not have to be buffered. The memory array itself is a storage array so an output buffer is not needed. For continuous pipelined operation, where a code word must be generated every clock cycle, an address calculator with a memory array can be ping-ponged with another address calculator and memory array. (Ping-ponging is writing to one array while the other is being read from.)

The address calculator calculates the location of the latest "1" is in a coded bit stream. For example, given the four input values 4, 1, 0, and 7, the resulting code words that are generated are the bits 00001,01,1, and 00000001, respectively. Table 1 shows the resulting coded bits when concatenated together into a 16 bit word. Assume that the left most bit in the output word is at address location zero, the addresses of the "1"s in the resulting 16 bit output word are also shown in Table 1.

TABLE 1

Example of a coded bit stream with the address locations of the terminating ones shown.

| coded bits | 0 | 0 | 0 | 0 | 1 | 0 | 1 | 1 | 0 | 0 | 0 | 0 | 0 | 0 | 0 | 1 |
|---|---|---|---|---|---|---|---|---|---|---|---|---|---|---|---|---|
| address of ones | | | | | 4 | | 6 | 7 | | | | | | | | 15 |

Addresses for the locations of "1"s can be calculated using a calculation that is iterative in nature. Except for the first integer value, the address calculator increments the value of the input integer m and adds it to the previous address. The value m is incremented because for an integer value m, the location of the terminating "1" is at m+1 bits. For memory arrays beginning with address zero, the location of the very first "1" is equal to the integer value m without the increment.

Table 2 shows examples of calculating the address of the latest "1" in an array of coded bits given 0, 2, 5, and 1 as input values. Notice that after the first value, the calculations for a new address are iterative: increment the value of m and add it to the previous address.

TABLE 2

Example of calculating cell addresses to write terminating "1"s for comma codes. The input string to encode is 0,2,5,1 which produces a 12 bit code string with 4 "1"s.

| input value m | code word length m + 1 | Equations for calculating addresses for "1"s | Address location of "1" | output codestring |
|---|---|---|---|---|
| 0 | 1 | Add = 0 + m | 0 | 1 |
| 2 | 3 | Add = Add + (m + 1) | 3 | 1001 |
| 5 | 6 | Add = Add + (m + 1) | 9 | 1001000001 |
| 1 | 2 | Add = Add + (m + 1) | 11 | 100100000101 |

Figure 4:
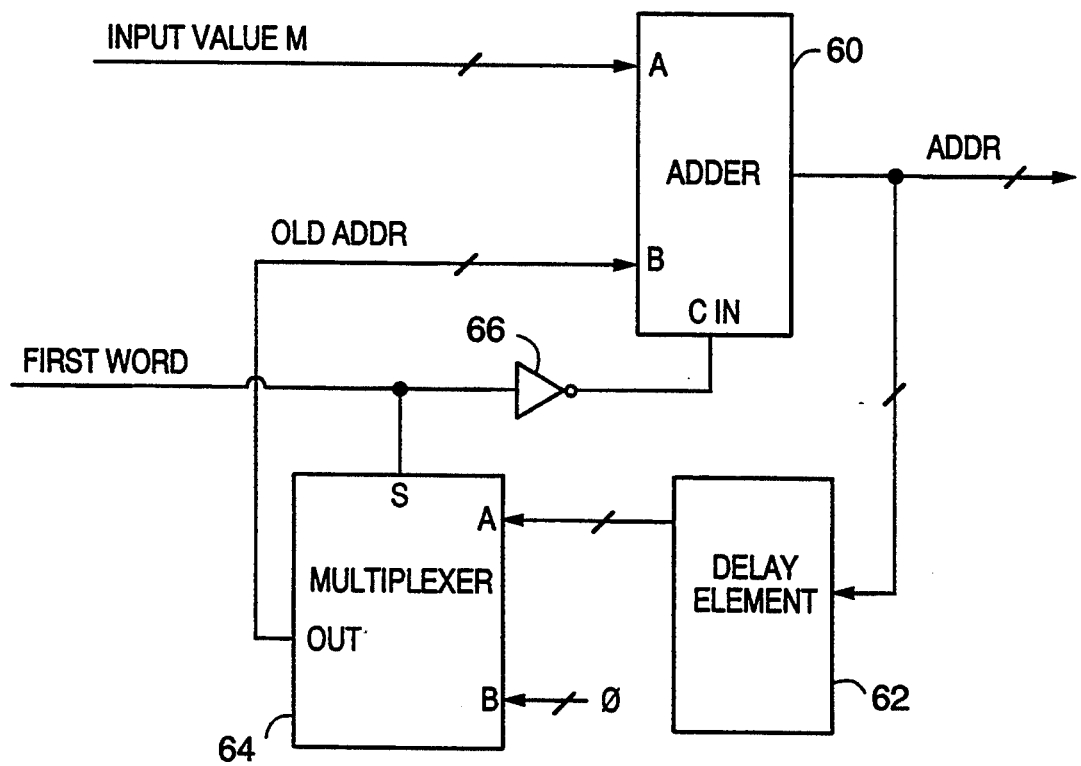
FIG. 4 shows a block diagram of an address calculator circuit that calculates where "1"s are written into the memory array (FIG. 5).

FIG. 4 shows a circuit that realizes the address calculation. An input value is coupled to a first input of an adder 60. The adder 60 is coupled to provide an address to a memory array (not shown) and to a delay element 62. The delay element buffers the address of the previous bit written to the memory array. The address contained in the delay element 62 is coupled to a first input of a multiplexor 64. A zero value is coupled to the second input of the multiplexor 64.

A signal FIRSTWORD is true during initialization and during the start of a new code block. The FIRSTWORD signal is coupled as a control input to a buffer/inverter 66 and to the multiplexor 64. It allows the first input word to become the address of the first "1" in the memory array. The output of the multiplexor 64 is coupled to a second input of the adder 60.

Subsequent addresses will be generated in an iterative nature in which the new address equals the old address added to the incremented m value. This circuit could also be realized by removing the multiplexor and having a delay element in which the output could be asynchronously cleared during the input of the firstword. For memory arrays where the first address is equal to one, the inverter should be removed and the carry in of the adder (labeled Cin) should be tied high forcing an increment for every data value including the first data value of a block.

When the address calculator is combined with a special memory array, discussed below, code words can be generated by knowing only where to terminate the code word (i.e., by writing a "1" to the terminating location). The following description and examples assume a memory array that has memory addresses that begin with an address of zero instead of a one.

The memory array has three major characteristics:
1. The memory elements must be able to be cleared before writing to it. The most straightforward implementation of this is just to clear the entire memory before beginning to generate the code words.
2. The memory array allows writing to single bit elements.
3. The data in the memory array can be formatted into M bit wide words so those words can be read out in parallel. (If the memory array were composed of loadable shift registers, or would allow reading from individual memory elements, then the data could be read out in a serial fashion.)

The operation of the memory array first involves clearing the array. Next, "1"s must be written into the appropriate locations to generate a code word. Because the comma code is defined so that there are m "0"s terminated by a single "1", writing a "1" to the appropriate location creates the code word. As long as a new address is presented to the memory array every clock cycle, a new code word can be generated every clock cycle. Writing to the M bit wide array automatically formats the output words to be M bits wide. The array replaces the more complicated hardware and control required to barrel shift and format shifted data.

Figure 5:
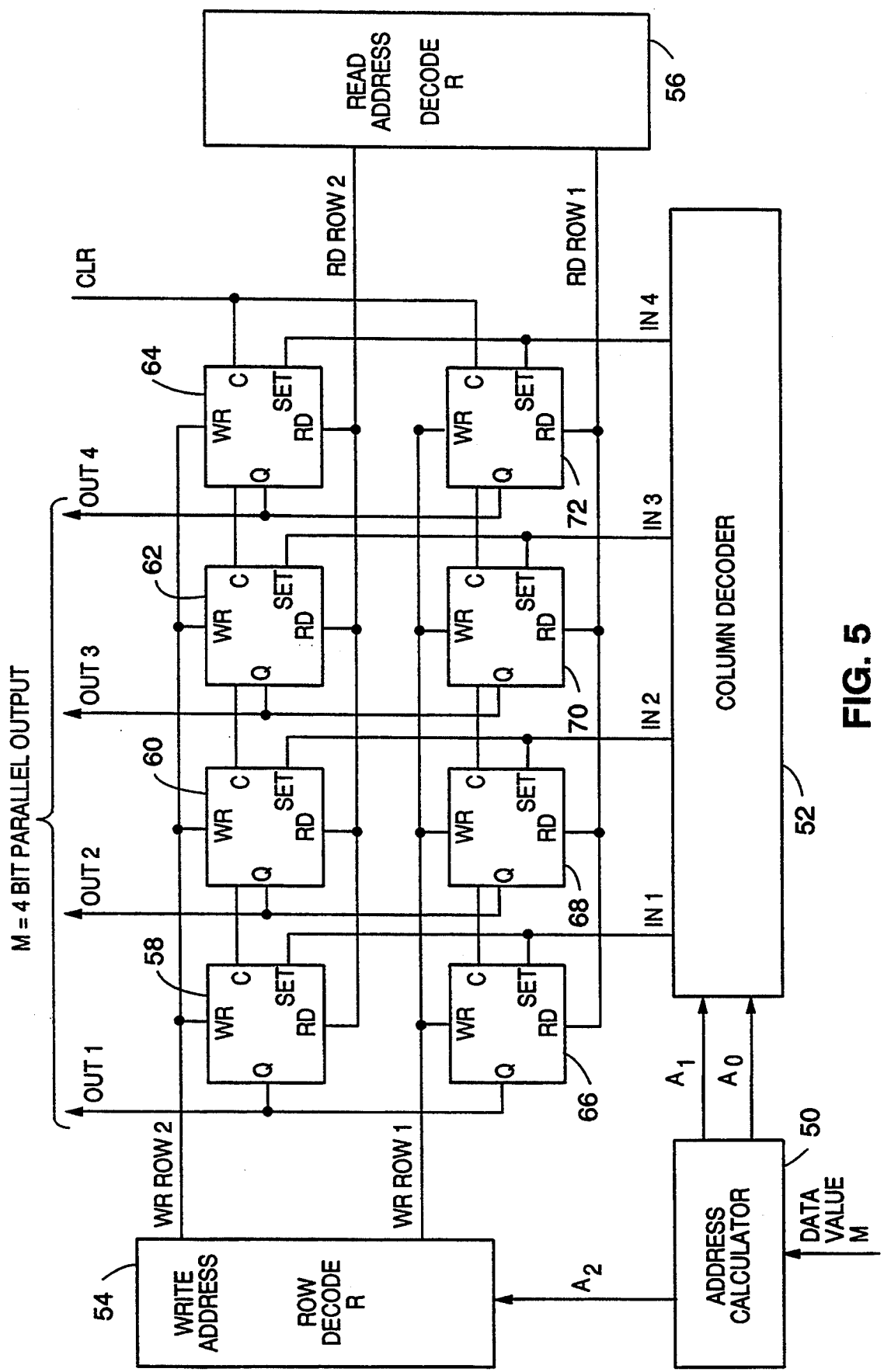
FIG. 5 shows an address calculating circuit coupled to a memory array structure that contains only 8 memory elements that are arranged to form a 4 bit wide output word.

FIG. 5 shows an example of an address calculator circuit coupled to a memory array structure that contains only 8 elements 58 through 72 that form a 4 bit wide output word. A data value m for a data word is coupled to an address calculator 50. The address calculator 50 calculates an appropriate address for one of the 8 elements 58 through 72. Because this is an 8 element memory, each address can be uniquely determined by three binary address bits. A first portion of the address bits are coupled to a column decoder 52 and a second portion of the address bits are coupled to a row decoder 54. Because the output of the array is a 4 bit word, there are two address bits $A_0$ and $A_1$ coupled to the column address decoder 52 and one address bit $A_1$ coupled to the row address decoder 54 as shown.

The row address decoder 54 also operates to provide a write enable signal for the memory elements 58 through 72. A read address decoder 56 is also coupled to each of the memory elements 58 through 72 to provide a read enable signal.

The row and column address decoders are coupled to each of the memory elements 58 through 72. Each memory element 58 through 72 has 4 inputs and one output. The output Q is assumed to be tri-stateable to allow sharing of output wires. The four inputs include two inputs for writing, the WR and SET inputs which both must be active high to write a "1" into the memory element. Each memory element 58 through 72 shares a common clear input labeled "C". When C is active high the memory elements 58 through 72 are cleared. RD is the read input. For those memory elements 58 through 72 in which RD is active high, the corresponding output Q for each of those elements is enabled.

The memory elements 58 through 72 must first be cleared before generating a code word. The address calculator, discussed previously, must provide the address for the first "1" to be written. Given the address, the row (WR ADDR signal) and column (IN signal) are selected to pinpoint the single element 58 through 72 to be written. Selecting a row and column sets the WR and SET inputs high and sets the selected memory element.

A simple method to sequentially read from the array is to use a shift register for controlling reading. First, clear the register, then input a single "1" to the shift serial input. Clocking the shift register will perform a one hot-code row decode.

If the memory array were made of RAM elements, the elements could be designed stable against "0"s with a write to a element occurring when WR=1 and the RAM element input is equal to a "1". (Alternately, the elements could be designed so that the signals going in were inverted: the element would be stable against "1"s and "0"s would be written to the elements. This could produce an inverted comma code which could be inverted upon leaving the RAM.)

Using a barrel shifter for generating a comma code allows the codes to be generated in one clock pulse, provided the barrel shifter and associated storage registers are wide enough to contain the word. Smaller barrel shifters can be used for large code words at the expense of requiring greater than 1 clock cycle to generate large code words.

The use of an address calculator coupled to a memory array for generating the comma code has advantages over the other methods because it can generate an arbitrarily long code word in a single clock cycle. The major requirement is that the code word fit within the memory array. Using an address calculator and array, ping-ponged with another calculator and array, doesn't require input buffering because it can keep up with the incoming data rate. An array, M bits wide, automatically formats the data into words M bits wide.

With the barrel shifter, the bits had to be successively packed until they equaled or exceeded the word size and then they had to be written to an external circuit. The barrel shifter can get very large if the maximum code word size is large; the address calculator with the memory array is more compact, increasing another M bits simply adds one more row of memory storage elements. Using an address calculating circuit coupled to a memory array to generate the code word removes the need for output buffering because the array itself provides storage. Control complexity is simple with this approach, the address calculator is composed of an adder, a multiplexor, a register, and an inverter.

What is claimed is:

1. An apparatus for generating a comma code comprising:
    a. means for receiving a data word having a data value m;
    b. a storage apparatus coupled to receive the data value, the storage apparatus having a plurality of single bit storage elements arranged to provide an M bit code word output;
    c. means for initializing each of the single bit storage elements to a first value; and
    d. means for selectively inverting a logic state of an appropriate one of the single bit storage elements.

2. The apparatus according to claim 1 wherein the means for selectively inverting comprises an address calculator for determining which of the plurality of single bit storage elements to invert.

3. The apparatus according to claim 1 further comprising means for transmitting a m+1 bit comma code word output to a receiving circuit.

4. The apparatus according to claim 3 further comprising means for concatenating two or more m+1 bit code words, where m is a variable based upon the data value m, for forming comma codes longer than M bits.

5. A comma code generator comprising:
    a. a shift device having an N bit barrel shifter coupled to a register, the register having a plurality of bit storage elements coupled to receive an m+1 bit comma code word, the device comprising:
        (1) means for receiving an m value data word; and
        (2) means for selectively inverting a logic state of an appropriate one of the bit storage elements determined in relation to m;
    b. first buffer storage means for receiving a first portion of the N bits in the barrel shifter comprising an M bit storage having an M bit output word and wherein M<N;
    c. second buffer storage means for receiving a second portion of the N bits in the barrel shifter comprising A remainder bits wherein A=N−M;
    d. means for transmitting the M bit output word to a receiving apparatus; and
    e. means for subsequently transmitting the A remainder bits to the means for receiving.

6. The apparatus according to claim 5 wherein the means for subsequently transmitting the A remainder bits comprises means for transmitting the A remainder bits to the first buffer storage means.

7. The apparatus according the claim 6 further comprising a multiplexer coupled to receive the M bit output word from the first buffer storage means and to receive the A remainder bits from the second buffer storage means.

8. A comma code generator comprising:
    a. means for receiving a data word having a data value m;
    b. an address calculator coupled to receive the data value m and calculating an address; and
    c. a memory array of bit storage elements arranged to have an M bit output word, the array being coupled to receive the address from the address calculator, the array comprising:
        (1) means for initializing the bit storage elements to a first logic state; and
        (2) means for selectively inverting the logic state of an appropriate one of the bit storage elements selected according to the address.

9. The apparatus according to claim 8 wherein the address calculator further comprises:
    a. means for storing a previous address;
    b. means for adding the previous address to the data value m for forming a result; and
    c. means for incrementing the result.

10. A method for generating a comma code comprising the steps of:
    a. receiving a data word having a data value m;
    b. providing a storage apparatus having a plurality of single bit storage elements arranged to provide an M bit code word output;
    c. initializing each of the single bit storage elements to a first binary value; and
    d. selectively inverting a logic state of an appropriate one of the single bit storage elements.

11. The method according to claim 10 further comprising the step of transmitting the M bit code word output to a receiving circuit.

12. The method according to claim 11 further comprising the step of concatenating two or more m+1 bit code words, where m is a variable based upon the data value m for forming comma codes longer than M bits.

13. The method according to claim 10 further comprising the steps of:
    a. storing a previous address;
    b. adding the previous address to the data value m for forming a result; and
    c. incrementing the result.

* * * * *